(12) United States Patent
Van De Kerkhof et al.

(10) Patent No.: US 7,375,799 B2
(45) Date of Patent: May 20, 2008

(54) LITHOGRAPHIC APPARATUS

(75) Inventors: Marcus Adrianus Van De Kerkhof, Helmond (NL); Wilhelmus Petrus De Boeij, Veldhoven (NL); Hendrikus Robertus Marie Van Greevenbroek, Eindhoven (NL); Michel Fransois Hubert Klaassen, Eindhoven (NL); Martijn Gerard Dominique Wehrens, Waalre (NL); Tammo Uitterdijk, De Bilt (NL)

(73) Assignee: ASML Netherlands B.V., Veldhoven (NL)

( * ) Notice: Subject to any disclaimer, the term of this patent is extended or adjusted under 35 U.S.C. 154(b) by 37 days.

(21) Appl. No.: 11/065,349

(22) Filed: Feb. 25, 2005

(65) Prior Publication Data

US 2006/0192937 A1    Aug. 31, 2006

(51) Int. Cl.
*G03B 27/72* (2006.01)
*G03B 27/54* (2006.01)

(52) U.S. Cl. .................................. 355/71; 355/67
(58) Field of Classification Search .................. 355/53, 355/55, 67–71, 52; 356/364–370
See application file for complete search history.

(56) References Cited

U.S. PATENT DOCUMENTS

| | | | | |
|---|---|---|---|---|
| 5,123,022 A * | 6/1992 | Ebbers et al. | ........... | 372/22 |
| 5,673,103 A * | 9/1997 | Inoue et al. | ........... | 355/71 |
| 6,078,393 A * | 6/2000 | Oohashi et al. | ........... | 356/511 |
| 6,234,634 B1 * | 5/2001 | Hansen et al. | ........... | 353/20 |
| 6,650,399 B2 | 11/2003 | Baselmans et al. | | |
| 6,859,264 B2 * | 2/2005 | Nakauchi et al. | ........... | 355/68 |
| 7,084,977 B2 * | 8/2006 | Nomura | ........... | 356/364 |
| 7,158,237 B2 * | 1/2007 | Schriever et al. | ........... | 356/515 |
| 2002/0001088 A1 | 1/2002 | Wegmann et al. | | |
| 2002/0024673 A1 * | 2/2002 | Ouchi | ........... | 356/495 |

(Continued)

OTHER PUBLICATIONS

Marcus Adrianus Van De Kerkhof, U.S. Appl. No. 10/935,741, filed Sep. 8, 2004.

(Continued)

*Primary Examiner*—Henry Hung Nguyen
(74) *Attorney, Agent, or Firm*—Pillsbury Winthrop Shaw Pittman LLP

(57) ABSTRACT

A lithographic apparatus includes an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and a detector for measuring the intensity of the radiation after it has passed through the projection system. The apparatus further includes a polarization changing element, such as a quarter-wave plate, that is adjustable; and a polarization analyzer, such as a linear polarizer, wherein the polarization changing element and the polarization analyzer are arranged in order in the radiation beam path at the level at which a patterning device would be held by the support. By taking intensity measurements, using the detector, for different rotational orientations of the polarization changing element, information on the state of polarization of the radiation at the level of the patterning device can be obtained. Because the polarization analyzer is located before the projection system, the measurements are not affected by the fact that the detector is located after the projection system, such as at the level of the substrate.

15 Claims, 3 Drawing Sheets

U.S. PATENT DOCUMENTS

2004/0114150 A1    6/2004  Wegmann et al.
2004/0248043 A1*  12/2004  Shiraishi .................... 430/311
2004/0262500 A1   12/2004  Mengel
2005/0099613 A1    5/2005  Fukuhara
2005/0146704 A1*   7/2005  Gruner et al. ................ 355/71
2006/0109533 A1*   5/2006  Schriever et al. ............. 359/15

OTHER PUBLICATIONS

International Search Report issued in International Application No. PCT/EP2006/005684 mailed Nov. 27, 2006.

* cited by examiner

LITHOGRAPHIC APPARATUS

FIELD

The present invention relates to a lithographic apparatus, and to the characterization and/or control of the polarization properties thereof.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The demand for ever-smaller features to be imaged with lithographic apparatus has resulted in the use of projection systems with increasing numerical aperture (NA). The angle of rays of radiation within the projection apparatus with respect to the optical axis increases with increasing NA. The vector nature of light becomes important for imaging because only identically polarized components of electromagnetic waves interfere. Therefore it is not the wavefront quality alone that determines the image contrast; the polarization has a considerable influence as well. Furthermore, the use of illumination radiation having specifically desired states of polarization for specific regions is increasingly being used for imaging features aligned in particular directions. Consequently, it is desirable to know the state of polarization of the radiation impinging on the patterning device, such as a reticle. It can also be desirable to know the effect on the state of polarization caused by the projection lens. However, no suitable measurement system currently exists. Existing radiation sensors built into lithographic apparatus are generally polarization insensitive. Furthermore it is thought that the state of polarization of the illumination radiation at the level of the patterning device cannot be measured at the level of the substrate without knowing the effect of the projection lens on the polarization. One way to avoid this would be to insert a polarization measurement system at the level of the reticle before the radiation enters the projection lens. However, this has the considerable problem of designing a measurement system to fit into the limited space and also to provide power and data connections to the measurement tool, either electrically or wirelessly, which would require significant down-time for installation, which is expensive. Reflection and transmission at interfaces and coatings and birefringence of the lens element materials are possible sources for polarization changes in the projection system. However, as previously explained, no measurement technique exists to characterize the polarization effects of the projection system.

SUMMARY

It is desirable to have knowledge of the state of polarization of the illumination radiation. It is also desirable to have information regarding the effect on the state of polarization of illumination radiation caused by the projection lens system.

According to one aspect of the invention there is provided a lithographic apparatus comprising:

an illumination system configured to condition a radiation beam;

a support constructed to support a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate; and a detector for measuring the intensity of the radiation after it has passed through the projection system, characterized by further comprising:

a polarization changing element that is adjustable; and a polarization analyzer, wherein the polarization changing element and the polarization analyzer are arranged in order in the radiation beam path at the level at which a patterning device would be held by the support.

According to another aspect of the invention there is provided a lithographic apparatus comprising:

an illumination system configured to condition a radiation beam;

a support constructed to support a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate; and an interferometric sensor for measuring the wavefront of the radiation beam at the level of the substrate, the interferometric sensor having a detector and operating in conjunction with a source module at the level of the patterning device for conditioning the radiation to overfill the pupil of the projection system, characterized by further comprising:

an adjustable polarizer for polarizing the radiation prior to the projection system.

According to a further aspect of the invention there is provided a method for determining at least one polarization property of a lithographic apparatus, the lithographic apparatus comprising:

an illumination system configured to condition a radiation beam;

a support constructed to support a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate;

a detector for measuring the intensity of the radiation after it has passed through the projection system, a polarization changing element that is adjustable; and a polarization analyzer, wherein the polarization changing element and the polarization analyzer are arranged in order in the radiation beam path at the level at which a patterning device would be held by the support, wherein the method comprises:

using the detector to take intensity measurements for a plurality of different settings of the polarization changing element; and determining, from the intensity measurements, information on the state of polarization of the radiation before it encounters the polarization changing element.

According to another aspect of the invention there is provided a method for determining at least one polarization property of a lithographic apparatus, the lithographic apparatus comprising:

an illumination system configured to condition a radiation beam;

a support constructed to support a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate; and an interferometric sensor for measuring the wavefront of the radiation beam at the level of the substrate, the interferometric sensor having a detector and operating in conjunction with a source module at the level of the patterning device for conditioning the radiation to overfill the pupil of the projection system, an adjustable polarizer for polarizing the radiation prior to the projection system, wherein the method comprises:

using the interferometric sensor to measure the respective wavefront of the radiation beam for two different settings of the polarizer; and determining, from the wavefront measurements, information on the polarization effecting properties of the projection system.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
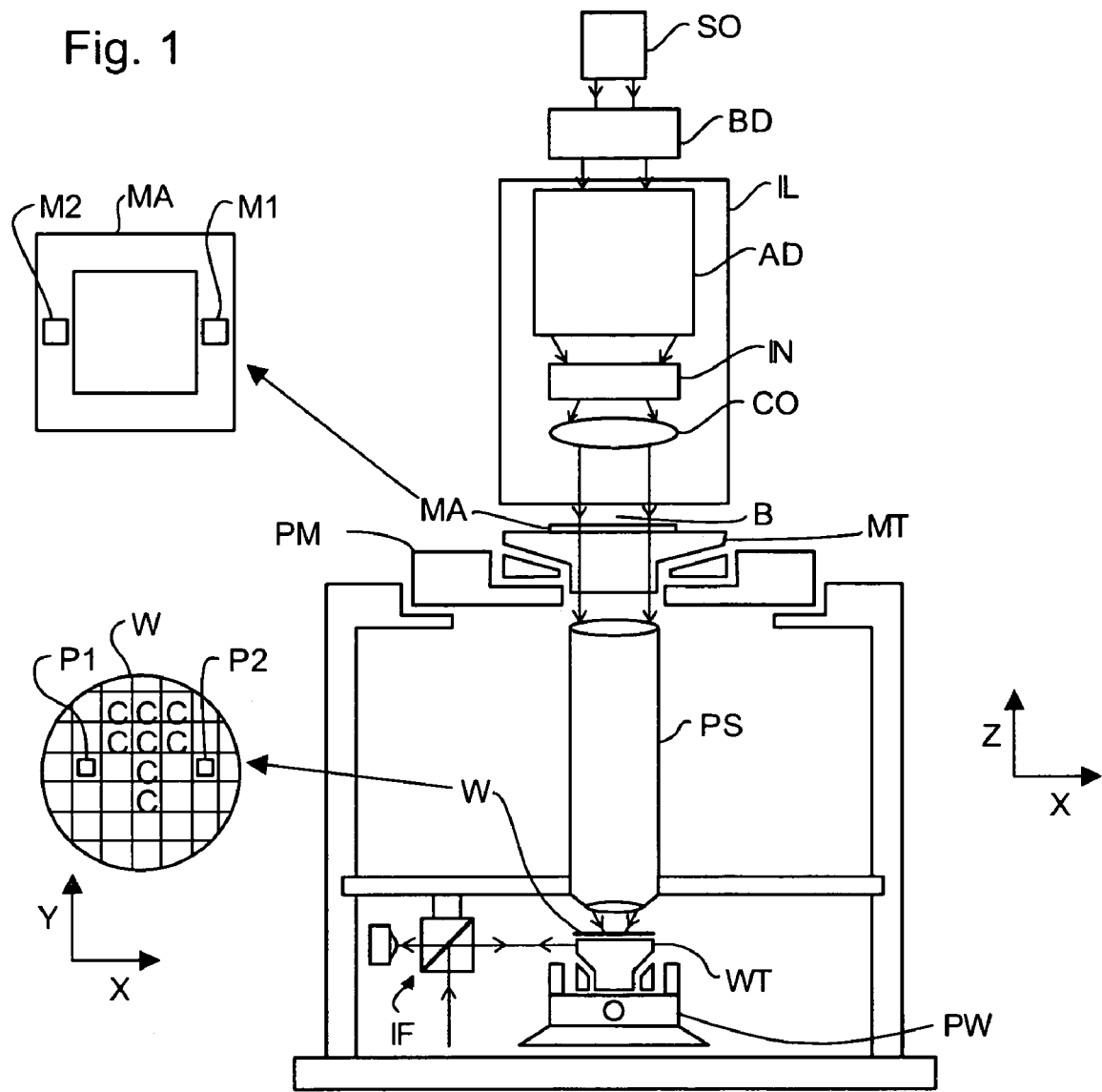
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam PB (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. The illuminator may also control the polarization of the radiation, which need not be uniform over the cross-section of the beam.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
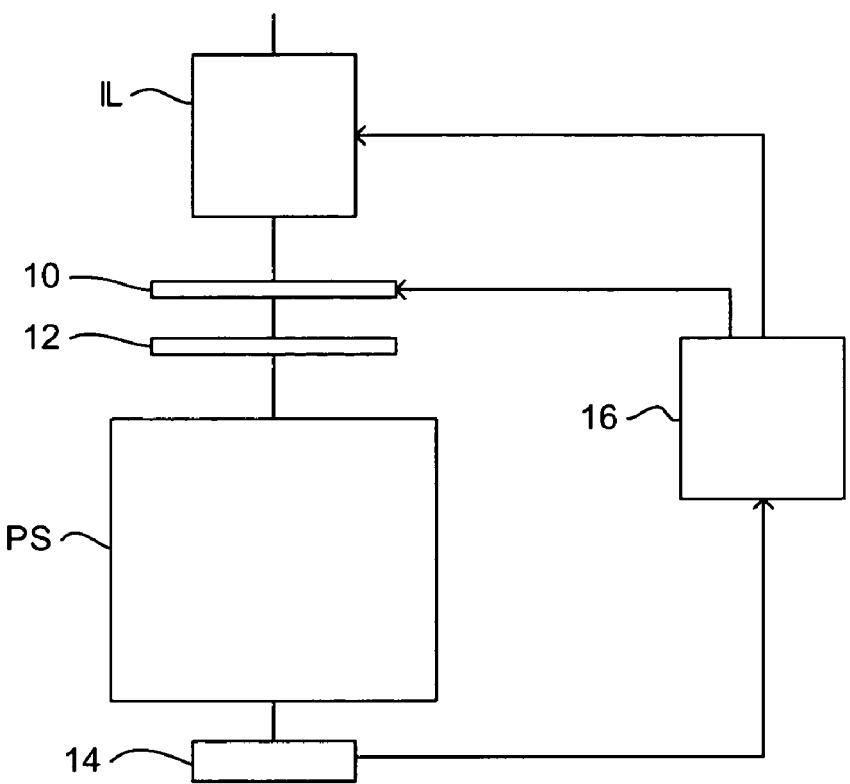
FIG. 2 shows schematically the lithographic apparatus according to a first embodiment of the invention.

FIG. 2 illustrates schematically an arrangement for measuring the state of polarization of the projection radiation at the level of the reticle. The illuminator IL and projection system PS, as in FIG. 1, are indicated. At the level of the reticle, and interposed into the beam path are an adjustable polarization changing element 10 followed by a polarization analyzer 12. In this example, the analyzer 12 is a linear polarizer, such as a beam-splitter cube, in a first fixed rotational orientation to transmit only the component of the radiation having an electric field vector in a specific direction. The polarization changing element 10 is a retarder, or retardation plate, and is preferably a quarter-wave plate for the particular wavelength of illumination radiation. A quarter-wave plate introduces a relative phase shift of B/2 between orthogonally linearly polarized components of incident radiation. This can convert suitably oriented linearly polarized radiation to circularly polarized radiation and vice versa. In general, it will change a general elliptically polarized beam into a different elliptically polarized beam.

The polarization changing element 10 is adjustable such that the polarization change induced can be varied. In one form of adjustment, the polarization-changing element 10 is rotatable such that the orientation of its principal axis can be adjusted. In another form of this example, the polarization changing element 10 is replaceable by a number of differently oriented polarization changing elements which can each be inserted in the beam path. The polarization changing element 10 can be completely removable and replaceable by a differently oriented polarization changing element 10, or a plurality of differently oriented polarization changing elements may be provided integrally on a carrier, similar to a reticle, for example in the form of an array. By translating the carrier then the polarization changing element corresponding to any particular field point can be adjusted.

A detector 14 for detecting the intensity of the radiation is provided in this embodiment of the invention after the radiation has passed through the projection system PS. The detector 14 can be a pre-existing detector provided at the substrate table. One form is a spot sensor which measures the radiation intensity at a particular point. Another form is a CCD camera that is provided for wavefront measurements. The CCD camera can be provided with a small aperture or pinhole at the focal plane of the projection system to select a desired field point. The CCD sensor itself is then defocused such that each pixel of the CCD detects radiation that has traversed a specific path through the projection system to reach that field point; in other words each pixel corresponds to a point in the pupil plane of the projection system (or pupil plane of the illuminator).

The arrangement of a rotatable quarter-wave plate followed by a linear polarizer and a detector is known in the field of ellipsometry to yield the state of polarization of the input radiation. A number of intensity measurements are taken at different rotational orientations of the quarter-wave plate and these can be converted to quantify the state of polarization expressed according to a suitable basis, such as the Stokes parameters to provide the Stokes vector characterizing the radiation. Further details regarding ellipsometry and obtaining Stokes parameters can be found in any suitable optics text book, such as *Principles of Optics*, M Born & E Wolf, seventh edition, Cambridge University Press (1999). At least three intensity measurements are required corresponding to three rotational positions of the quarter-wave plate. Although there are four Stokes parameters, there is some redundancy between them, so three measurements can determine them at least normalized with respect to the overall intensity of the radiation.

According to the present invention, a controller 16 receives measurements from the detector 14, which in conjunction with the control and/or detection of the adjustment of the polarization changing element 10, such as its rotational orientation, can calculate the state of polarization e.g. Stokes parameters, for each pupil pixel. The detector can be moved and the measurements repeated for different field points.

The question arises concerning how this invention can still work when the detector does not immediately follow the analyzer 12. Instead, there is the projection system PS with its unknown polarization effect. However, the significant point is that the analyzer 12 closely follows the polarization changing element 10; it does not matter that there are further components between the analyzer 12 and the detector 14 because the detector 14 is insensitive to polarization variation. The situation can be considered theoretically in the following way. If the radiation exiting the polarization changing element 10 has a state of polarization represented by the Stokes vector $S_{in}$, then the state of polarization following the analyzer 12, called $S_{out}$, can be found by multiplying $S_{in}$ by the Müller matrix $M_{pol}$ representing the operation of the analyzer 12 (linear polarizer). The coordinate system can be arbitrarily chosen such that the analyzer 12 is a polarizer in the X-direction. Thus the state of polarization (Stokes vector) of the radiation at the ideal detector position is as follows:

$$S_{out} = M_{pol} \cdot S_{in} = \frac{1}{2} \begin{pmatrix} 1 & 1 & 0 & 0 \\ 1 & 1 & 0 & 0 \\ 0 & 0 & 0 & 0 \\ 0 & 0 & 0 & 0 \end{pmatrix} \begin{pmatrix} S_0 \\ S_1 \\ S_2 \\ S_3 \end{pmatrix} = \frac{1}{2} \begin{pmatrix} S_0 + S_1 \\ S_0 + S_1 \\ 0 \\ 0 \end{pmatrix}$$

The irradiance as measured by the detector is given by the first element of the Stokes vector, and so is:

$$I_{det} = \frac{1}{2}(S_0 + S_1)$$

Now for the real situation illustrated in FIG. 2, we can use a general Müller matrix $M_{gen}$ to represent the effect of the projection system and indeed any non-idealities of the detector.

$$\begin{aligned} S_{out} &= M_{gen} \cdot M_{pol} S_{in} \\ &= \begin{pmatrix} m_{11} & m_{12} & m_{13} & m_{14} \\ m_{21} & m_{22} & m_{23} & m_{24} \\ m_{31} & m_{32} & m_{33} & m_{34} \\ m_{41} & m_{42} & m_{43} & m_{44} \end{pmatrix} \frac{1}{2} \begin{pmatrix} 1 & 1 & 0 & 0 \\ 1 & 1 & 0 & 0 \\ 0 & 0 & 0 & 0 \\ 0 & 0 & 0 & 0 \end{pmatrix} \begin{pmatrix} S_0 \\ S_1 \\ S_2 \\ S_3 \end{pmatrix} \\ &= \begin{pmatrix} m_{11} & m_{12} & m_{13} & m_{14} \\ m_{21} & m_{22} & m_{23} & m_{24} \\ m_{31} & m_{32} & m_{33} & m_{34} \\ m_{41} & m_{42} & m_{43} & m_{44} \end{pmatrix} \frac{1}{2} \begin{pmatrix} S_0 + S_1 \\ S_0 + S_1 \\ 0 \\ 0 \end{pmatrix} \\ &= \frac{1}{2} \begin{pmatrix} m_{11}(S_0 + S_1) + m_{12}(S_0 + S_1) \\ m_{21}(S_0 + S_1) + m_{12}(S_0 + S_1) \\ 0 \\ 0 \end{pmatrix} \end{aligned}$$

So the irradiance as measured by the detector is:

$$I_{det} = \frac{1}{2}(m_{11} + m_{12})(S_0 + S_1)$$

So this is equal to the previous result with an ideal detector immediately following the analyzer, apart from a factor $(m_{11}+m_{12})$, where $m_{11}$ and $m_{12}$ are elements of the Müller matrix representing the projection system. Thus the measurements taken by the detector 14 are unaffected apart from a constant factor, and it is not necessary to know the value of this factor because it cancels out in the ellipsometry calculation. Thus the polarization properties, such as polarization degree and polarization purity at the level of the reticle can be completely determined. The influence of the projection system is almost completely eliminated by having the polarizer 12 at reticle level; only the intensity is altered.

As explained above, it is not necessary to know the value of the factor ($m_{11}+m_{12}$). However, it can be useful to have this information, in particular when the value of this factor is not constant over the pupil area. If it varies over the pupil area, then the operator cannot tell whether this is due to polarization properties of the projection lens or due to imperfections in the illumination radiation. For example, with a quadruple illumination mode in combination with tangential polarization, two poles may appear less bright than the other two poles. This may either be caused by asymmetries in the illumination system or by a residual linearly polarizing effect of the projection lens. By determining which, appropriate corrections can be made. To determine which, the analyzer 12 is rotated to a second fixed rotational orientation and the Stokes parameters are measured again. From the two measurement sets, one can identify the contribution of the projection lens and the illumination system as separate entities.

Figure 3:
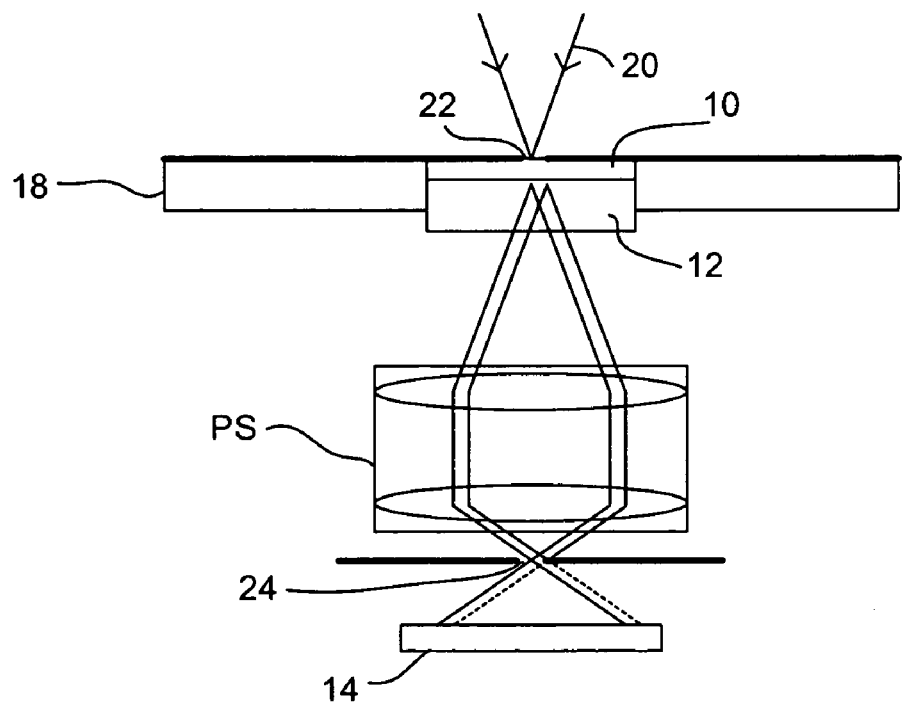
FIG. 3 shows schematically the lithographic apparatus according to a modification of the first embodiment of the invention.

FIG. 3 shows another embodiment of the invention. In this example the polarization changing element 10 and the analyzer 12 are integrated into a carrier 18 that can be inserted into the lithographic apparatus in place of a reticle. Radiation 20 from the illuminator is incident on a pinhole 22 comprising an aperture in an opaque layer, such as chromium, formed on the upper surface of the carrier 18. The polarization changing element 10 is preferably a quarter-wave plate, and preferably a low order quarter-wave plate to minimize its thickness, and can be made of a suitable material such as quartz. The analyzer 12 in this embodiment does not simply block or absorb one linear polarization component, but instead is a prism made of a birefringent material arranged such that the two orthogonal linearly polarized components are spatially separated, in other words it is a polarizing beam splitter. According to one form, the prism comprises two wedges of crystals of the birefringent material in contact with each other, but the orientation of the principal optical axis of the crystal in one wedge is in the X direction, and in the other wedge is in the Y direction (i.e. in the form of a Wollaston prism). A suitable birefringent material from which to make the prism, and which can be used with short-wavelength illumination radiation, is KDP (potassium dihydrogen phosphate).

The effect of the polarizing beam splitter as the analyzer 12 is that when looking from underneath into the illumination radiation, one sees two pinholes next to each other, the radiation from one pinhole being polarized along the X axis, and the radiation from the other pinhole being polarized along the Y axis. A second pinhole 24, which may be an integral part of the detector can be positioned at the focal plane of the projection system to selectively transmit one polarized image of the first pinhole 22 and block radiation from the other. A defocused detector 14, such as a CCD, measures the intensity for a plurality of pixels corresponding to locations in the pupil plane of the projection system and illuminator.

With one of the polarized images not transmitted by the second pinhole 24, the apparatus can be used in exactly the same way as described for FIG. 2 to determine the state of polarization of the illumination radiation at reticle level. The carrier 18 can be provided with a plurality of pinholes 22, polarization changing elements 10, and analyzers 12, with the polarization changing element 10 being at different rotational orientations, such as with its fast axis along the X direction, along the Y direction and at 45° to the X and Y directions. By translating the carrier 18, the polarization changing element corresponding to a particular field location can be adjusted, and ellipsometry measurements can be made as before. Moving the second pinhole 24 to select the orthogonally polarized radiation is equivalent to rotating the analyzer 12 of FIG. 2 through 90°. Thus further measurements can be readily made to obtain information characterising the state of polarization of the radiation. As also explained previously with reference to FIG. 2, using the second pinhole 24 to select the two different polarizations enables one to separate the contributions of the projection system and the illuminator, but in this case it is not necessary to have a rotatable or removable/replaceable analyzer 12 because the polarizing beam splitter used as the analyzer 12 in FIG. 3 simultaneously performs the function of two orthogonal linear polarizers.

A further embodiment of the invention, for measuring the polarization properties of the projection system, will now be described. Previously there has been proposed a measurement system for measuring wavefront aberrations of a projection system using the principle known as a "shearing interferometer". According to this proposal, different portions of the projection beam from a particular location at the level of the patterning device travel along different paths through the projection lens. This can be achieved by a diffractive element located in the projection beam between the illumination system and the projection system. The diffractive element, such as a grating, also known as the object grating, diffracts the radiation and spreads it out such that it passes through the projection system along a plurality of different paths. The diffractive element is typically located at the level at which the patterning device, e.g. mask MA is located. The diffractive element can be a grating or can be an array of features of suitable size, and may be provided within a pinhole. One or more lenses may also be associated with the diffractive element. This assembly as a whole, located in the projection beam between the illuminator and the projection system will be referred to hereafter as the source module.

Figure 4:
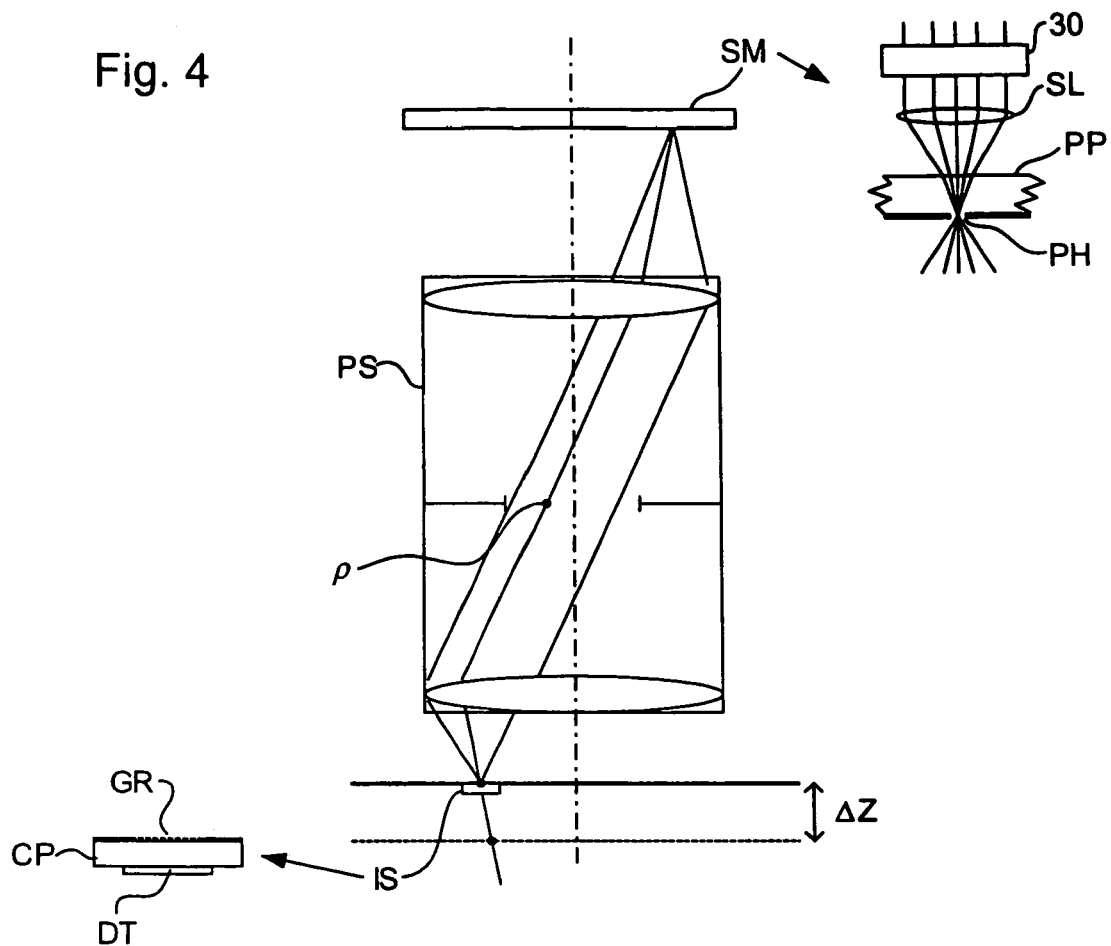
FIG. 4 shows schematically the lithographic apparatus according to a further embodiment of the invention.

Referring to FIG. 4, a source module SM for use with an embodiment of the present invention is illustrated. It comprises a pinhole plate PP which is a quartz glass plate with an opaque chromium layer on one side, same as a reticle, and with a pinhole PH provided in the chromium layer. It also comprises a lens SL for focusing the projection radiation on to the pinhole. In practice an array of pinholes and lenses for different field positions and different slit positions are provided, and the lenses can be integrated on top of the pinhole plate. The source module should ideally generate light within a wide range of angles such that the pupil of the projection lens is filled, or indeed overfilled, for numerical aperture measurements, and preferably the pupil filling should be uniform. The use of the lens SL can achieve the over-filling and also increases the light intensity. The pinhole PH limits the light to a specific location within the field. Alternative ways to obtain uniform pupil filling are to use a diffuser plate (such as an etched ground glass plate) on top of the pinhole plate, or an array of microlenses (similar to a diffractive optical element DOE), or a holographic diffusor (similar to a phase-shift mask PSM). The pinhole may have some structuring within, such as sub-resolution diffractive features e.g. grating patterns, checkerboard patterns, but this is optional, and preferably there is no structuring for embodiments of the invention. Thus specific source module SM embodiments include; as illustrated in FIG. 4; as illustrated but without the focusing lens and with a diffusor on top; and a pinhole mask with sub-resolution features inside.

Radiation that has traversed the projection system then impinges on a further diffractive element GR, such as a pinhole or a grating, known as the image grating. Referring to FIG. 4, the further diffractive element GR is mounted on a carrier plate CP, for example made of quartz. This further diffractive element acts as the "shearing mechanism" that generates different diffractive orders which can be made to interfere with each other. For example, the zero order may be made to interfere with the first order. This interference results in a pattern, which can be detected by a detector to reveal information on the wavefront aberration at a particular location in the image field. The detector DT can be, for example, a CCD or CMOS camera which captures the image of the pattern electronically without using a resist. The further diffractive element GR and the detector DT will be referred to as the interferometric sensor IS. Conventionally, the further diffractive element GR is located at the level of the substrate at the plane of best focus, such that it is at a conjugate plane with respect to the first-mentioned diffractive element in the source module SM. The detector DT is below the further diffractive element GR and spaced apart from it.

One proprietary form of an interferometric wavefront measurement system implemented on lithography tools is know as ILIAS (trademark) which is an acronym for Integrated Lens Interferometer At Scanner. This measurement system is routinely provided on lithographic projection apparatus. Further information on such an interferometric system provided on a lithography scanner apparatus can be gleaned from U.S. Pat. No. 6,650,399 B2 which is incorporated herein by reference in its entirety.

The interferometric sensor essentially measures the derivative phase of the wavefront. The detector itself can only measure light intensity, but by using interference the phase can be converted to intensity. Most interferometers require a secondary reference beam to create an interference pattern, but this would be hard to implement in a lithographic projection apparatus. However a class of interferometer which does not have this requirement is the shearing interferometer. In the case of lateral shearing, interference occurs between the wavefront and a laterally displaced (sheared) copy of the original wavefront. In the present embodiment, the further diffractive element GR splits the wavefront into multiple wavefronts which are slightly displaced (sheared) with respect to each other. Interference is observed between them. In the present case only the zero and +/− first diffraction orders are considered. The intensity of the interference pattern relates to the phase difference between the zero and first diffraction orders.

It can be shown that the intensity I is given by the following approximate relation:

$$I \approx 4E_0 E_1 \cos\left(2\pi i \left[\frac{k}{p} + \frac{1}{2}\left(W\left(\rho + \frac{1}{p}\right) - W\left(\rho - \frac{1}{p}\right)\right)\right]\right)$$

where $E_0$ and $E_1$ are the diffraction efficiencies for the zero and first diffracted orders, k is the phase stepping distance, p is the grating periodicity (in units of waves), W is the wavefront aberration (in units of waves) and $\rho$ is the pupil location. In the case of small shearing distances, the wavefront phase difference approximates the wavefront derivative. By performing successive intensity measurements, with a slight displacement of the source module SM with respect to the interferometric sensor IS, the detected radiation intensity is modulated (the phase stepping factor k/p in the above equation is varied). The first harmonics (with the period of the grating as the fundamental frequency) of the modulated signal correspond to the diffraction orders of interest (0 & +/−1). The phase distribution (as a function of pupil location) corresponds to the wavefront difference of interest. By shearing in two substantially perpendicular directions, the wavefront difference in two directions is considered.

As well as phase measurements on the wavefront as described above, amplitude measurements can also be made. These are done by using a source at reticle level with a calibrated angular intensity distribution. One example is to use an array of effective point sources (with dimensions smaller than the wavelength of the radiation used), where each point source has an intensity distribution which is effectively uniform over the range of solid angles present within the projection system pupil. Other sources are also possible. Variations in detected intensity can then be related to attenuation along particular transmission paths through the projection system. Further information regarding amplitude measurements and obtaining the angular transmission properties of the projection system (also called apodization) are given in U.S. Ser. No. 10/935,741 which is incorporated herein by reference in its entirety.

According to the present aspect of the invention, the above wavefront measurements (both phase and amplitude) are performed using a polarized radiation source. One embodiment, as shown in FIG. 4, is to incorporate a polarizer 30, such as a beam splitter cube, into the source module SM; an alternative embodiment would be to use separate discrete insertable polarizers, for example insertable at the illuminator or reticle masking level. No modification of the interferometric sensor IS is required.

The wavefront Wx is first measured using the source radiation linearly polarized in one direction, such as the X direction. The polarizer or source module is then rotated or exchanged/displaced, such that the radiation is linearly polarized in the Y-direction, and the new wavefront Wy is then measured. For convenience, a single source module carrier can be provided with an unpolarized, an X-polarized and a Y-polarized source structure, and loaded as a normal reticle. The reticle stage is able to move freely in the scanning direction, so for each filed point (normal to the scanning direction) the unpolarized, an X-polarized and a Y-polarized source structure can be provided.

The effect on polarized light of an optical element or combination of optical elements, such as the projection system, can be represented by a Jones matrix. The X and Y components of the electric field vector of incident and outgoing electromagnetic radiation are related by the Jones matrix as follows:

$$\begin{pmatrix} E_{x\_out} \\ E_{y\_out} \end{pmatrix} = \begin{pmatrix} J_{xx} & J_{xy} \\ J_{yx} & J_{yy} \end{pmatrix} \begin{pmatrix} E_{x\_in} \\ E_{y\_in} \end{pmatrix}$$

For lithographic apparatus projection systems, it is valid to assume that the off-diagonal elements in the Jones matrices are very small (i.e. practically zero) relative to the diagonal elements, in other words very little cross talk of X and Y polarization states occurs. Therefore using an X-polarized source enables the diagonal element $J_{xx}$ to be determined from the wavefront measurement, and using a Y-polarized source enables the diagonal element $J_{yy}$ to be determined from the wavefront measurements. Both phase and amplitude measurements of the wavefront are needed because each element of the Jones matrix is in general a complex number.

For a specific field point, a Jones matrix can be calculated for each pupil point in the projection system (each Jones matrix corresponding to the effect on polarization of a ray of radiation taking a particular path through the projection system). The source module and interferometric sensor can be moved to a different field point and a set of Jones matrices obtained. Thus each combination of field point and pupil point has its own specific Jones matrix.

One concern might be that the device in the source module for ensuring that the projection system pupil is over-filled, such as a diffusor, might result in mixing of polarization states. However, this is not expected to be a significant effect because the characteristic length scales of small-angle diffusors are typically about 0.05 mm. However, even if mixing should occur this can be straightforward to remedy by combining the X and Y wavefront measurements and solving a set of linear equations. Supposing a fraction a of polarization mixing occurs within the source module, the following set of equations is found:

$$W_{x\_meas} = (1-a).W_x + a.W_y$$

$$W_{y\_meas} = a.W_x + (1-a).W_y$$

The mixing factor a can be found either theoretically or by a calibration (done off-line) and then the equations can be resolved to find the desired X and Y polarized wavefronts Wx and Wy. The same procedure can also be applied if the polarizer used does not yield perfect polarization purity.

Figure 5:
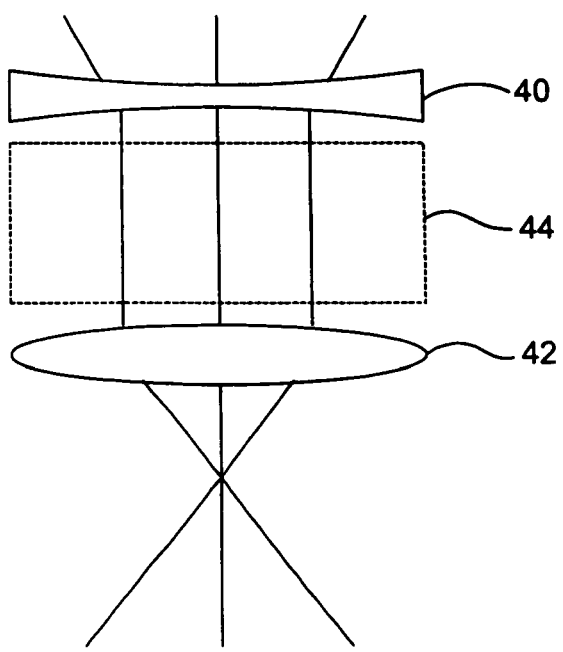
FIG. 5 schematically illustrates an arrangement for collimating the radiation in the region of the polarization-active components.

In any of the previously described embodiments in which polarization-active components are used, such as polarizers, retarders (quarter-wave plates), polarizing beam splitters and so on, the angle of propagation of the radiation can have a significant effect on the performance of the component. Therefore it is advantageous to locate these components at a place where the light is substantially collimated. One option is to locate the elements such as the polarization changing element 10 and the analyzer 12 at a suitable location in the illuminator where the light is already substantially collimated. A second alternative is to provide optical elements 40 and 42, as shown in FIG. 5, which firstly collimate the radiation and then focus it. This provides a zone 44 in which the radiation is in the form of a collimated beam and in which the polarization-active components can be placed.

The results of the measurements according to any of the above embodiments of the invention can be used to provide feedback. For example, in an apparatus in which a desired polarization pattern is intended to be set by the illuminator, actuators can be provided for adjusting components of the lithographic apparatus by way of feedback based on the obtained measurements. FIG. 2 illustrates, by way of example, that the illuminator IL may be adjusted under the control of the controller 16 to correct or compensate for any measured deviations in the desired polarization pattern.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
   an illumination system configured to condition a radiation beam;
   a support constructed to support a patterning device, the patterning device being capable of imparting the radiation beam with a pattern in its cross-section to form a patterned radiation beam;
   a substrate table constructed to hold a substrate;
   a projection system configured to project the patterned radiation beam onto a target portion of the substrate;
   a detector for measuring the intensity of the radiation after it has passed through the projection system;
   an adjustable polarization changing element; and
   a polarization analyzer,
   wherein the polarization changing element and the polarization analyzer are arranged in order in the radiation beam path at a level at which the patterning device would be supported by the support.

2. A lithographic apparatus according to claim 1, wherein the polarization changing element is adjustable by being rotatable and/or exchangeable.

3. A lithographic apparatus according to claim 1, wherein the polarization changing element is a quarter-wave plate.

4. A lithographic apparatus according to claim 1, wherein the polarization analyzer is a linear polarizer.

5. A lithographic apparatus according to claim 1, wherein the polarization analyzer is a polarizing beam-splitter arranged to output two orthogonally linearly polarized radiation components, spatially separated from one another.

6. A lithographic apparatus according to claim 5, wherein the polarization analyzer consists essentially of KDP.

7. A lithographic apparatus comprising:
   an illumination system configured to condition a radiation beam;

a support constructed to support a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate;

an interferometric sensor for measuring a wavefront of the radiation beam at a level of the substrate, the interferometric sensor having a detector and operating in conjunction with a source module at the level of the patterning device for conditioning the radiation to overfill the pupil of the projection system; and an adjustable polarizer for polarizing the radiation prior to the projection system.

8. A lithographic apparatus according to claim 7, wherein the polarizer is a linear polarizer and is adjustable by being at least one of rotatable and exchangeable, to polarize the radiation sequentially in two different directions.

9. A lithographic apparatus according to claim 7, further comprising a controller for taking the results of the measurements by the detector, controlling the adjustable element and calculating at least one polarization property of the apparatus.

10. A lithographic apparatus according to claim 9, wherein the controller further controls one or more elements of the apparatus in response to the at least one calculated polarization property of the apparatus.

11. A lithographic apparatus according to claim 1, further comprising a controller for taking the results of the measurements by the detector, controlling the adjustable element and calculating at least one polarization property of the apparatus.

12. A lithographic apparatus according to claim 11, wherein the controller further controls one or more elements of the apparatus in response to the at least one calculated polarization property of the apparatus.

13. A method for determining at least one polarization property of a lithographic apparatus comprising:

using a detector at a substrate level of the apparatus to take intensity measurements for a plurality of different settings of a polarization changing element, positioned in the radiation beam path at a level at which a patterning device would be supported; and determining, from the intensity measurements, information on a state of polarization of the radiation before it encounters the polarization changing element.

14. A method for determining at least one polarization property of a lithographic apparatus, comprising:

using an interferometric sensor of the lithographic apparatus to measure respective wavefronts of the radiation beam at a substrate level of the apparatus for two different settings of an adjustable polarizer that is positioned in the lithographic apparatus at a level at which a patterning device would be supported; and determining, from the wavefront measurements, information on polarization affecting properties of the projection system.

15. A method according to claim 14, wherein the information on the polarization affecting properties of the projection system is expressed as at least one element of a Jones matrix.

* * * * *